United States Patent [19]

Chang

[11] Patent Number: 4,956,749
[45] Date of Patent: Sep. 11, 1990

[54] INTERCONNECT STRUCTURE FOR INTEGRATED CIRCUITS

[75] Inventor: Cheng-Cheng Chang, Palo Alto, Calif.

[73] Assignee: Hewlett-Packard Company, Palo Alto, Calif.

[21] Appl. No.: 123,488

[22] Filed: Nov. 20, 1987

[51] Int. Cl.⁵ .............................................. H05K 7/20
[52] U.S. Cl. .................................... 361/414; 29/840; 29/850; 361/386; 361/412; 361/408
[58] Field of Search ............... 174/68.5; 361/386–389, 361/397, 404, 406, 412, 414; 29/840, 850

[56] References Cited

U.S. PATENT DOCUMENTS

| | | | |
|---|---|---|---|
| 3,365,620 | 1/1986 | Butler et al. | 361/385 |
| 4,245,273 | 1/1981 | Feinberg et al. | 361/382 |
| 4,665,468 | 5/1987 | Dohya | 361/397 |
| 4,679,321 | 7/1987 | Plonski | 29/850 |

Primary Examiner—Gregory D. Thompson

[57] ABSTRACT

A semiconductor integrated device support structure having a transmission line interconnect structure in a metal block on which the devices are mounted. The metal block is formed photolithographically from layers which define X,Y sections of the block. A plurality of stacked layers contains the complete wireline interconnect network. Each wire is a true coaxial transmission line having an inner conductor, a surrounding dielectric material and an outer conductor. By appropriate choice of radii of the inner conductor and the surrounding dielectric material, favorable impedances may be selected.

16 Claims, 4 Drawing Sheets

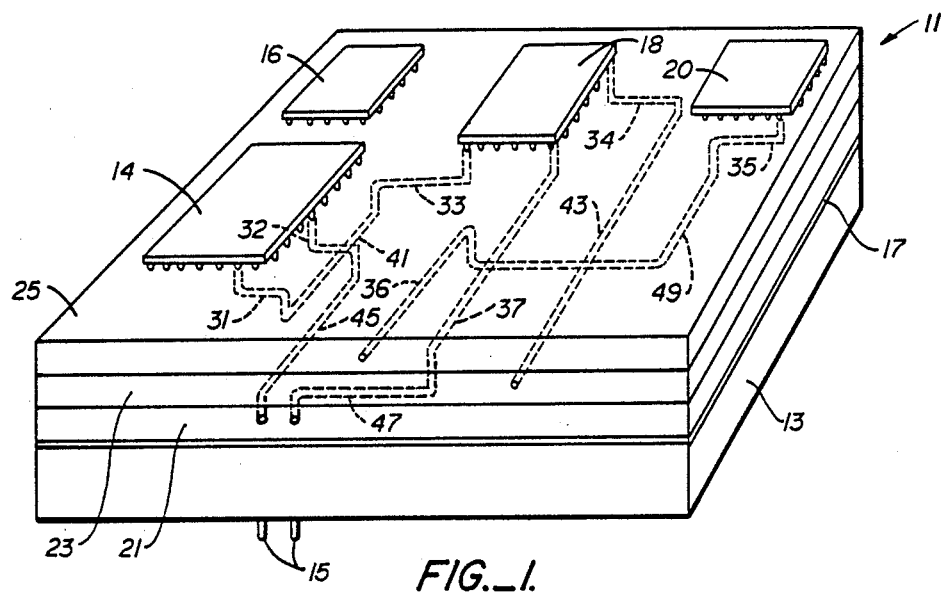
FIG.\_1.
FIG.\_3.
FIG.\_4.
FIG.\_5.
FIG.\_6.
FIG.\_7.

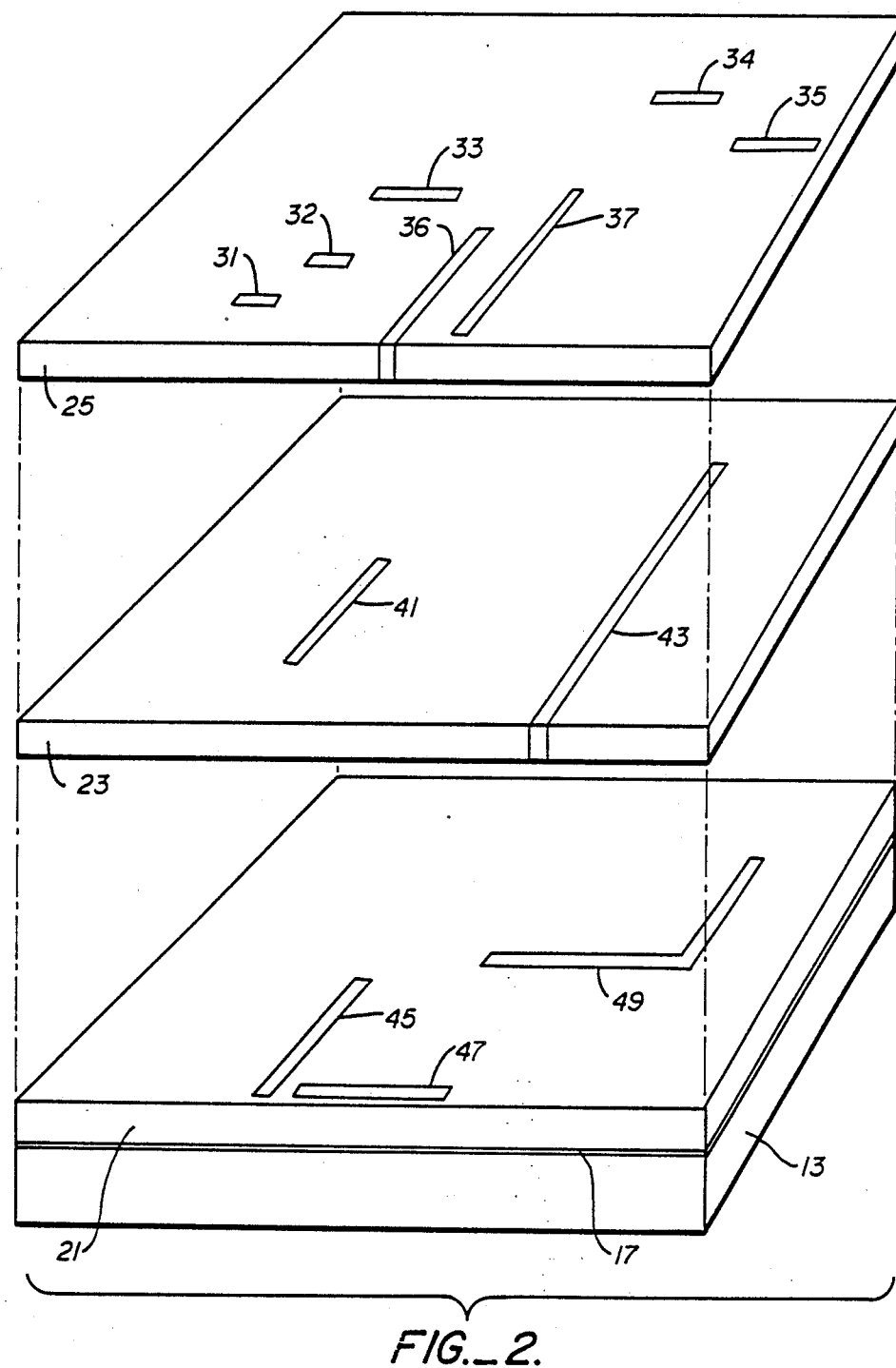
FIG._2.

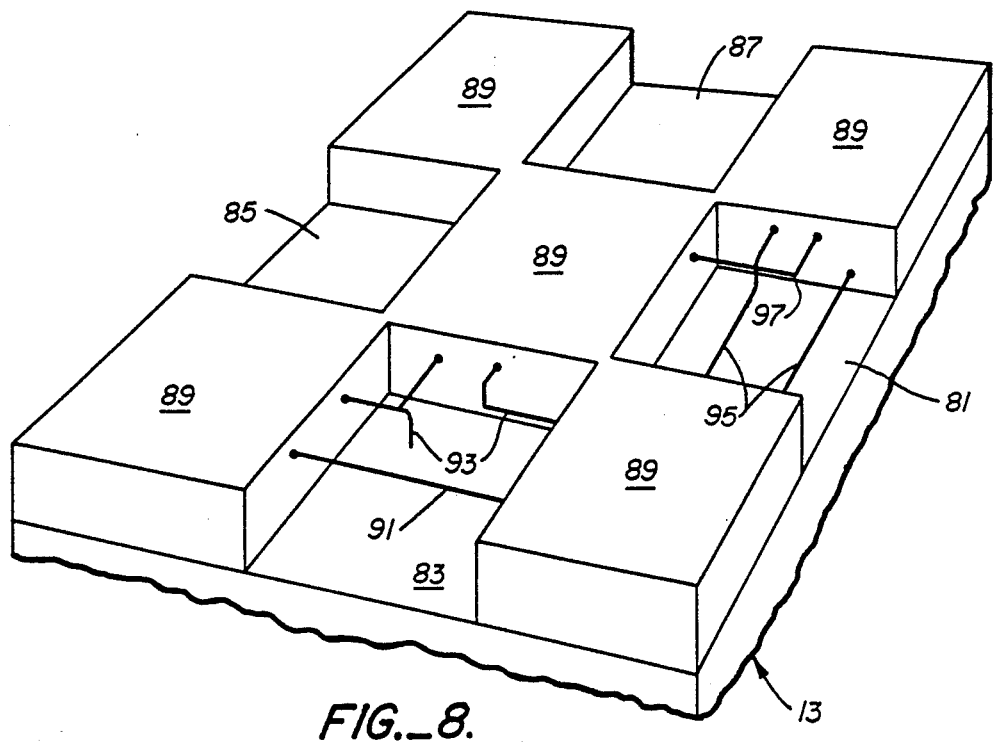
FIG._8.
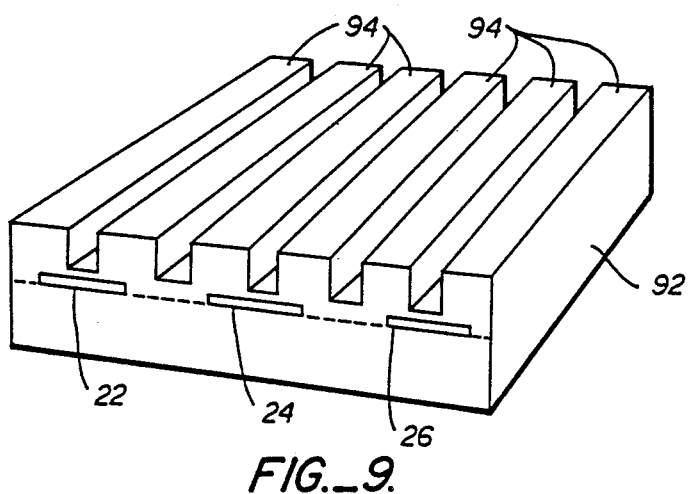
FIG._9.

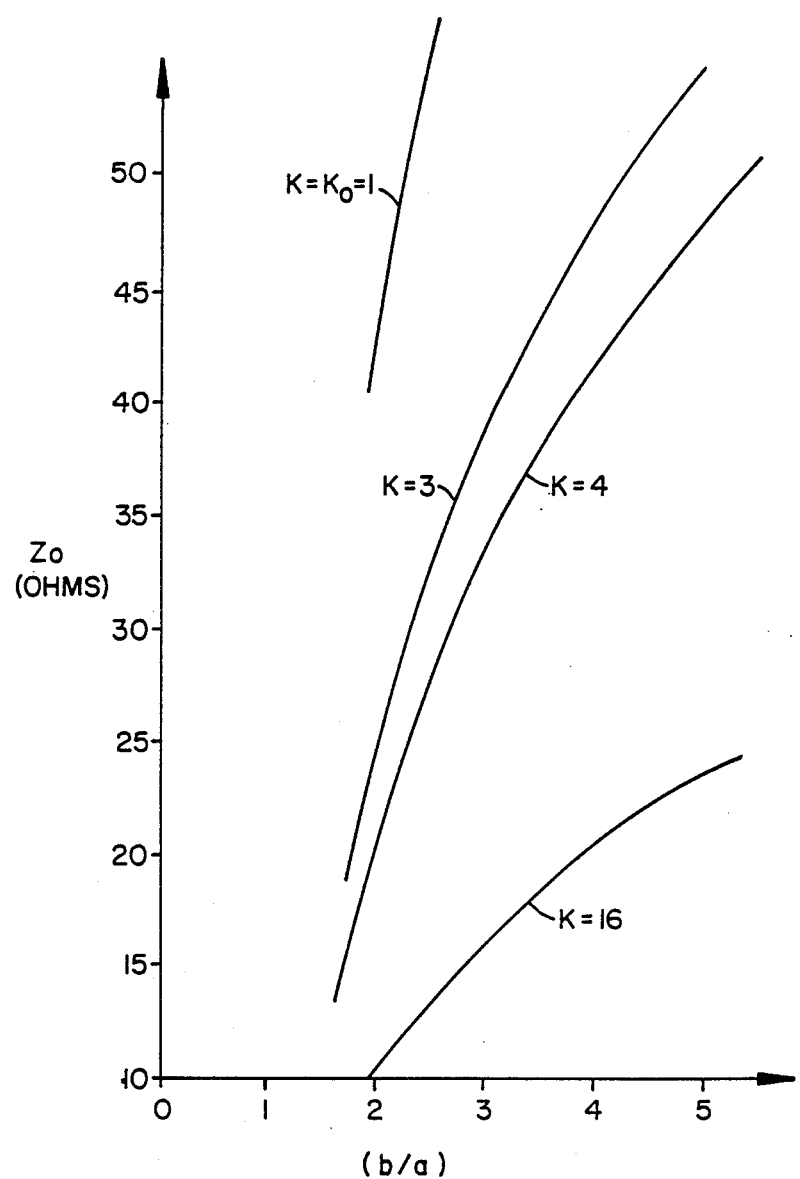
FIG._10.

4,956,749

INTERCONNECT STRUCTURE FOR INTEGRATED CIRCUITS

DESCRIPTION

1. Technical Field

The invention relates to a construction for a holder of a plurality of integrated circuits and more particularly to a holder containing a wire interconnect network for such circuits.

2. Background Art

In prior years there has been an attempt to join large numbers of integrated circuits on a single wafer. This effort has been known as wafer scale integration. Several problems were encountered, mainly related to random defects on a wafer which could ruin the entire wafer integration scheme. Another problem was one of interconnecting the several circuits. Very large scale integration frequently involves several layers of metal and so it was difficult to add more layers of metal over existing layers. Even if more layers were not added, it would be difficult to make interconnections on the surface of a wafer due to limited space between circuits. Perhaps an even more difficult problem is one of cooling the very dense arrangement of circuits on a common substrate.

In an article in Scientific American, July, 1983, pgs. 86–96, A. J. Blodgett describes an integrated circuit chip mounting system where the chips are mounted in close proximity on a multilayer ceramic substrate with chip interconnections below the chip mounting level. On top of the chips is a cooling structure which employs water channels for heat removal.

In U.S. Pat. No. 4,245,273 Feinberg et al. disclose a mounting package for large scale integrated devices featuring a sintered multilayer ceramic substrate with an internal wiring network with conductive voltage planes above and below signal planes to obtain a transmission line effect for the signal lines. The wiring network is made up of voltage planes, X and Y signal planes, and fan-out planes. A heat removal cap is mounted above the devices.

In U.S. Pat. No. 4,665,468, A. Dohya discloses a multi-layer module including photosensitive insulating layers supporting a wire line matrix photolithographically formed in the layers. The chip mounting approaches of the prior art have recognized the practical difficulties with wafer scale integration and have attempted to find supports for mounting large numbers of integrated devices, especially very large scale integrated circuits. The prior art is characterized by mounting integrated circuit chips on insulating substrates and insulating layers containing wire interconnections.

An object of the present invention is to devise a mounting structure for a number of semiconductor integrated circuits which combines chip interconnection aspects with cooling aspects, while reducing signal loss and cross-talk.

SUMMARY OF INVENTION

The above object has been achieved with a metal block semiconductor device support structure with a built-in wire interconnection grid. The semiconductor device interconnection structure of the present invention is built on a substrate, layer by layer, with each layer being a section of a metalization pattern and the remainder being resist. Each layer defines x,y sections of a metalization pattern, while the aggregation of layers defines the z component of the pattern. When the metallization pattern is finished, all or part of the resist is removed and the bare metal network is coated with dielectric material to a thickness appropriate for a true coaxial transmission line.

The structure is metal plated to form a three dimensional support block. If part of the resist has been masked to provide support during dielectric coating, the masked portion is now removed and the exposed wire structure is coated with dielectric material, as previously done and the coated structure is metal plated. The base of the substrate has pins connected to the metal interconnect pattern while the upper portion of the plated block has exposed terminals of the interconnect pattern to which integrated circuit devices are joined. The metal plating should have both good electrical and thermal conductivity. Heat may be removed by placing a heat sink into contact with the metal block. The metal plating also completes a coaxial transmission line structure for the interconnection pattern. The transmission line structure limits electrical losses between components and limits stray capacitance between components.

BRIEF DESCRIPTION OF THE DRAWINGS

FIG. 1 is a perspective view of an integrated circuit interconnection structure in accord with the present invention.

FIG. 2 is a perspective view of exploded layers forming a portion of the structure shown in FIG. 1.

FIGS. 3–6 show construction steps for forming the layered integrated circuit interconnection structure of the present invention.

FIG. 7 is a detail showing a transmission line cross-section.

FIG. 8 is a perspective view illustrating an alternate construction method.

FIG. 9 is a perspective view showing a cooling structure in combination with the integrated circuit interconnection structure of the present invention.

FIG. 10 is a plot showing transmission line parameters versus electrical impedance.

BEST MODE FOR CARRYING OUT THE INVENTION

With reference to FIGS. 1 and 2, an integrated circuit interconnection structure 11 is shown. The structure includes a nonconductive planar substrate 13 through which electrical terminal members 15 project. These terminal members are located at signal interface locations where connectors will unite the structure to other electrical devices. Other projecting electrical terminal members are not shown. Over the substrate is an electrically conductive metal block 17 formed by a number of layers 21, 23 and 25. The various layers contain portions of interconnection transmission lines. The segments 31–37 are seen to all lie in layer 25. These transmission line segments extend completely through the layer whose construction will be described below. In layer 23, the segments 41 and 43 are seen. In layer 21, the segments 45, 47 and 49 may be seen. The vertical paths seen in FIG. 1 are formed by placing one layer atop the next. Where overlying segments intersect, a vertical path is established, as seen with reference to FIGS. 3–6. At a location where the wire interconnection terminates, spaced from the signal interface location, solder bumps (not shown) or the like allow interconnection of chips 14, 16, 18 and 20 to the wire interconnection network. The chips are finished semiconductor integrated circuits. The wire network is intended to provide signal and utility paths to other electrical devices.

With reference to FIG. 3, a substrate 13 is coated with a layer of resist 51. This layer is patterned with openings 53 in the usual way in which semiconductor integrated circuits are made. In other words, the resist is exposed through a mask and the openings 53 are made after exposure.

In FIG. 4, the openings are filled with metal 55. The metal is selected to have good electrical conductivity, preferably at least as good as aluminum. The metal is applied in any of the conventional methods used in integrated circuit processing, such as chemical vapor deposition, sputtering, or metal plating. The upper surface 57 is then chemically etched to remove excess metal so that metal only resides in the openings.

In FIG. 5, a second layer of resist 61 is applied over the first level. Openings 63 and 65 are formed, These are then filled with conductive metal in the manner previously described. In FIG. 6, further layers of resist 67 and 69 are sequentially deposited over layer 61. Each of these layers of resist is patterned, then openings are made in a manner previously described and then the openings are filled with the same conductive metal as previously described, leaving the metal member 71 having X and Y components which lie in individual layers and having a vertical or Z component portions which result from the overlying of sequential layers with metal at the same X,Y location.

Once a metal interconnect structure has been completed, all of the remaining resist is removed by solvent or etchant. What remains is a very fragile wire network which lies in the positions established by the resist. The metal is slightly etched by the resist solvent, sufficiently to clean the metal and round the corners of the metal, although rounding is not critical. The metal is then coated with a coating of dielectric material, sufficient to insulate the metal network from a subsequent metallic plating. The thickness of the dielectric material should be one which will provide desired coaxial transmission line properties, mainly a desired impedance. Since the choice of dielectric material influences impedance, the dielectric material should be carefully selected. Possible materials include silicone (relative dielectric constant $K=2.7$) or Teflon ($K=2.2$). Teflon is a registered trademark for a polytetrafluoroethylene polymer. While the spacing between any two wires is not critical, the wires should not be closer than signal skin depth to avoid cross-talk.

Once the metal network has been coated with a selected dielectric material, the entire structure may be plated with a conductive material 78 to complete a transmission line structure. In FIG. 7, the central metal conductor 75 is shown to have a radius, a, indicated by an arrow. The surrounding dielectric material 77 is shown to have a radius, b, indicated by an arrow. While the term radius is used to describe a radial dimension, the cross sections of conductor 75 and dielectric sheath 77 are generally not perfectly circular, although they are preferred to be circular when processing permits. FIG. 7 shows a roughly circular cross-sectional shape. A polygonal cross section may approximate a circular cross section in certain instances. The ratio of b/a is important in establishing the impedance ($Z_o$) of a transmission line, in ohms, as given by the following equation:

$$Z_o = \frac{60}{\sqrt{K/K_o}} \ln\left(\frac{b}{a}\right)$$

while K is the relative constant of the dielectric material, $K_o$ is the free space dielectric constant. A conductive metal block 78 surrounds the dielectric sheath 77. The metal interconnection is a true coaxial transmission line which provides a quiet and noise free medium for electrical signals.

Previously, it was mentioned that after a wire interconnection pattern is established, all resist is removed prior to dielectric coating of the wire. In the embodiment of FIG. 8, the resist is patterned in checkerboard fashion in order to use portions of the resist as support for the wire pattern. For example, resist regions 81, 83, 85 and 87 have been removed, exposing wires 91, 93, 95 and 97. After these exposed wires have been coated with dielectric material to form portions of coaxial transmission lines, the exposed transmission lines are metal plated to form a checkerboard block of plated material and resist. The plating should completely encapsulate the transmission line network. Then, the remaining resist regions 89 are removed, exposing the remainder of the wire which is then coated with the dielectric material and the unplated regions of the checkerboard pattern are then plated with the same plating material such that a conductive block completely encloses or encapsulates the wire network. Integrated circuit chips are then mounted to the wire network by means of solder bumps or the like associated with each chip.

The metal plating material should be a good electrical conductor as well as a thermal conductor. The plating may be applied by electroless plating or by electrolytic plating. For example, copper or electroless nickel or any electrically conductive material could be used to form the outer conductor of the transmission line network. Copper provides a simple plating process and has good electrical and thermal properties. One of the advantages of the metal block formed by the plating is that heat generated from the integrated circuit chips will be conducted directly to this solid metal block. The block can be shaped to form an efficient heat sink, cooled by air or liquid.

In FIG. 9, the metal block 92 is shown to include further plating over the top of the integrated circuit chips 22, 24 and 26. The plating applied over the top of the chips is formed into fins 94 for the purpose of heat dissipation. However, the cooling structure need not be on top of the chips. Instead, heat sinks may be placed in contact with the sides of the metal block.

FIG. 10 is a plot of the ratio of the radii of the inner conductor to surrounding dielectric material (b/a) against impedance for different dielectric materials. It will be seen that an impedance in the range of between 10 to 50 ohms is attainable with a wide range of common dielectric materials.

I claim:

1. An interconnection structure for semiconductor integrated circuits comprising, a substrate having a plurality of electrical terminal members therein, an electrically conductive metal block disposed over the substrate with a component mounting surface, the metal block containing an electrically conductive wire interconnection pattern, insulated from the metal block, extending from the plurality of electrical terminal members associated with the substrate to the component mounting surface of the block, and a plurality of semiconductor integrated circuits joined to the wire interconnection pattern at the mounting surface.

2. The interconnection structure of claim 1 wherein wires comprising said wire interconnection pattern have a dielectric material coating coaxially surrounding said wires in the pattern, with said dielectric material coating contacting the metal block.

3. The interconnection structure of claim 2, wherein said wires have an average radius, a, and said dielectric material coating has an average radius, b, wherein the ratio b/a is characteristic of a transmission line having a desired impedance for the selected dielectric material.

4. The interconnection structure of claim 1 wherein said electrical terminal members are pins extending from said substrate and in electrical communication with said wire interconnection pattern.

5. A method of interconnecting finished integrated circuits with a coaxial transmission line network comprising,
   (a) building a network of bare electrically conductive wires over a nonconductive substrate in a three dimensional structure extending from chip contact locations to wire terminal members projecting through said substrate at signal interface locations spaced apart from the chip contact locations,
   (b) coating the built network of bare wires over said substrate with a selected dielectric material to form a plurality of coaxial transmission lines each having an impedance dependent on the ratio of a diameter of the dielectric material to a diameter of the conductive wires, and
   (c) encapsulating the dielectrically coated bare wires with metal.

6. The method of claim 5 further defined by providing said wires with an average diameter a, and said dielectric material coating with an average outer diameter b, where the ratio b/a is characteristic of a respective coaxial transmission line having a desired impedance for said selected dielectric material.

7. The method of claim 5 further defined by terminating the chip contact locations in solder bumps.

8. The method of claim 5 wherein said metal for encapsulating the dielectrically coated bare wires is selected from copper and nickel plating.

9. The method of claim 5 further defined by building said network of wires photolithographically.

10. The method of claim 5 further defined by forming thermally conductive fins in said metal encapsulating said coated wires.

11. The method of claim 5 further defined by building said network of wires one layer upon another.

12. A method for interconnecting finished semiconductor integrated circuits comprising,
   providing a substrate having a planar upper surface and a plurality of electrical terminal members therein,
   patterning a first planar layer over the planar substrate surface, the pattern comprising resist regions and electrically conductive metal regions, the metal regions communicating with the electrical terminal members and being x,y sections of a three dimensional wire interconnection pattern,
   patterning further planar layers, each atop a lower patterned planar layer, the pattern in each layer comprising resist and electrically conductive metal regions and being x,y sections of a three dimensional wire interconnection pattern, the further planar layers defining a z direction for the interconnection pattern wherein x,y and z are orthogonal coordinate directions, the uppermost layer having metal regions in locations corresponding to contact locations of finished semiconductor integrated circuits,
   removing the resist from all layers, leaving an exposed electrically conductive metal interconnection pattern,
   coating the metal interconnection pattern, with a coaxial sheath of dielectric material, the coating having a thickness sufficient to prevent electrical shorting between the interconnection pattern and subsequent metal plating,
   applying metal plating to the dielectric material in a volume forming a support block encapsulating the dielectric coated metal interconnection pattern, and
   joining finished semiconductor integrated circuits to exposed metal regions in the upper surface of the uppermost layer.

13. The method of claim 12 wherein said metal regions in each of said planar layers have an average radius, a, and said coaxial sheath of dielectric material coating the metal interconnection pattern has an average radius, b.

14. The method of claim 12 wherein said metal regions in each of said planar layers have an average radius, a, and said dielectric material coating the metal interconnection pattern has an average radius, b, wherein the ratio b/a is characteristic of a coaxial transmission line having a desired impedance for the selected dielectric material.

15. The method of claim 12 wherein said plating is copper or electroless nickel plating.

16. A method of interconnecting finished integrated circuits comprising,
   building a network of bare electrically conductive wires in a three dimensional structure extending from chip contact locations to signal interface locations spaced apart from the chip contact locations,
   coating the bare wires with a dielectric material to form a plurality of coaxial transmission lines each having an impedance dependent on the ratio of a diameter of the dielectric material to a diameter of the respective conductive wire, and
   encapsulating the dielectrically coated bare wires with metal, thereby completing a transmission line network and forming said metal to establish one or more thermally conductive fins.

* * * * *